United States Patent
Park et al.

(10) Patent No.: US 7,692,998 B2
(45) Date of Patent: Apr. 6, 2010

(54) CIRCUIT OF DETECTING POWER-UP AND POWER-DOWN

(75) Inventors: Hwan-Wook Park, Seongnam-si (KR); Woo-Seop Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 318 days.

(21) Appl. No.: 11/979,424

(22) Filed: Nov. 2, 2007

(65) Prior Publication Data

US 2008/0106966 A1 May 8, 2008

(30) Foreign Application Priority Data

Nov. 3, 2006 (KR) .................. 10-2006-0108495

(51) Int. Cl.
*G11C 5/14* (2006.01)
(52) U.S. Cl. .............. 365/227; 365/229; 365/230.03; 365/207
(58) Field of Classification Search ............ 365/227, 365/229, 230.03, 207
See application file for complete search history.

(56) References Cited

U.S. PATENT DOCUMENTS

| 6,611,472 | B2 * | 8/2003 | Kitamoto et al. ............ 365/227 |
| 6,650,594 | B1 | 11/2003 | Lee et al. |
| 7,372,746 | B2 * | 5/2008 | Kim ............................ 365/227 |
| 2004/0111649 | A1 | 6/2004 | Lin et al. |
| 2005/0117432 | A1 | 6/2005 | Graaff et al. |

\* cited by examiner

*Primary Examiner*—Huan Hoang
(74) *Attorney, Agent, or Firm*—Harness, Dickey & Pierce, P.L.C.

(57) ABSTRACT

A power-up/power-down detecting circuit may include a power detecting circuit, a selecting circuit, and a determining circuit. The power detecting circuit may generate a plurality of detection signals based on a plurality of sensing signals corresponding to currents flowing through a plurality of function blocks. The selecting circuit may generate a plurality of selection signals. The determining circuit may generate a power-up completion signal and a power-down completion signal. A semiconductor device having the power-up/power-down detecting circuit may determine in real time the power-up time and the power-down time.

24 Claims, 7 Drawing Sheets

CIRCUIT OF DETECTING POWER-UP AND POWER-DOWN

PRIORITY STATEMENT

This application claims priority under 35 USC §119 to Korean Patent Application No. 2006-108495, filed on Nov. 3, 2006 in the Korean Intellectual Property Office (KIPO), the entire contents of which are incorporated herein by reference.

BACKGROUND

1. Field

Example embodiments relate to a circuit and a method of detecting power-up and power-down in a semiconductor device.

2. Description of Related Art

Because electronic systems are continually becoming smaller, research on decreasing the power dissipated by semiconductor devices has increased. For example, standby circuit blocks in a semiconductor device may be powered down depending on the operation mode in order to decrease power dissipation. In a powered down state, a circuit block is not completely powered off but a current source included in the circuit block is turned off to reduce the leakage current.

Power-up time and power-down time may be included in the test specification of a semiconductor memory device.

In the conventional method of detecting a power-up or a power-down, it is determined if a circuit enters the power-down mode or exits the power-down mode by measuring the mean current flowing through the circuit. The power-down entering time or the power-down exit time cannot be measured using the conventional method because the operating current of the circuit is not measured in real time using a tester. The standby time for the power-up/power-down of the semiconductor memory device, which may be determined via testing, may be longer since a margin has to be added to the measured time for the power-up/power-down. Thus, operation speed may be degraded.

SUMMARY

Example embodiments provide a power-up/power-down detecting circuit capable of providing the power-up time and the power-down time in real time. Example embodiments also provide a semiconductor device having the power-up/power-down detecting circuit and a memory system having the semiconductor device. Further, example embodiments provide a method of detecting a power-up or a power-down for providing the power-up time and the power-down time in real time.

According to example embodiments, a power-up/power-down detecting circuit may include a power detecting circuit, a selecting circuit, and a determining circuit.

The power detecting circuit may generate a plurality of detection signals based on a plurality of sensing signals corresponding to currents flowing through a plurality of function blocks. The selecting circuit may generate a plurality of selection signals based on a power-up/power-down mode selection control signal and the detection signals. The determining circuit may perform a logical operation on the selection signals in response to an up/down control signal to generate a power-up completion signal and a power-down completion signal.

The power-up/power-down detecting circuit may further comprise a decoder that decodes a power-mode signal to generate the power-up/power-down mode selection control signal and the up/down control signal.

The power-up completion signal may be enabled when all the selection signals are enabled. The power-up completion signal may be enabled in response to the selection signal that is enabled last.

The power-up delay may be determined by the time period from the time when the power-mode signal is enabled to the time when the power-up completion signal is enabled.

The power-down completion signal may be enabled when all the selection signals are disabled. The power-down completion signal may be enabled in response to the selection signal that is disabled last.

The power-down delay may be determined by the time period from the time when the power-mode signal is enabled to the time when the power-down completion signal is enabled.

According to example embodiments, a semiconductor device may include an internal circuit and a power-up/power-down detecting circuit.

The internal circuit may include a plurality of function blocks, and may generate a plurality of sensing signals. The power-up/power-down detecting circuit may generate a power-up completion signal and a power-down completion signal based on a power-mode signal and the sensing signals. The power-up completion signal and the power-down completion signal may indicate the power-up time and the power-down time, respectively.

According to example embodiments, a memory system may include a semiconductor memory device and a memory controller.

The semiconductor memory device may store input data or output stored data in response to a clock signal, a command signal, and an address. The semiconductor memory device may detect currents flowing through circuit blocks in real time to determine the power-up time and the power-down time. The semiconductor memory device may generate a power-up completion signal and a power-down completion signal.

The memory controller may provide the clock signal, the command signal, the address, and the input data to the semiconductor memory device in response to the power-up completion signal or the power-down completion signal.

According to example embodiments, a method of detecting a power-up or a power-down may include generating a plurality of detection signals based on a plurality of sensing signals corresponding to currents flowing through a plurality of function blocks, generating a plurality of selection signals based on a power-up/power-down mode selection control signal and the detection signals, and performing a logical operation on the selection signals in response to an up/down control signal to generate a power-up completion signal and a power-down completion signal.

BRIEF DESCRIPTION OF THE DRAWINGS

Example embodiments will be more clearly understood from the following detailed description taken in conjunction with the accompanying drawings.

FIG. 1 is a block diagram illustrating a memory system according to example embodiments.

FIG. 2 is a block diagram illustrating a power-up/power-down detecting circuit according to example embodiments.

FIG. 3 is a block diagram illustrating an example of a power detector included in the power-up/power-down detecting circuit of FIG. 2.

FIG. 4 is a block diagram illustrating another example of a power detector included in the power-up/power-down detecting circuit of FIG. 2.

FIG. 5 is a graph illustrating hysteresis characteristics of the power detectors of FIG. 3 and FIG. 4.

FIG. 6 is a block diagram illustrating an example of a selecting circuit and a determining circuit included in the power-up/power-down detecting circuit of FIG. 2.

FIG. 7 is a block diagram illustrating another example of a selecting circuit and a determining circuit included in the power-up/power-down detecting circuit of FIG. 2.

FIG. 8 and FIG. 9 are timing diagrams illustrating operations of the power-up/power-down detecting circuit of FIG. 2.

DESCRIPTION OF EXAMPLE EMBODIMENTS

Figure 1:
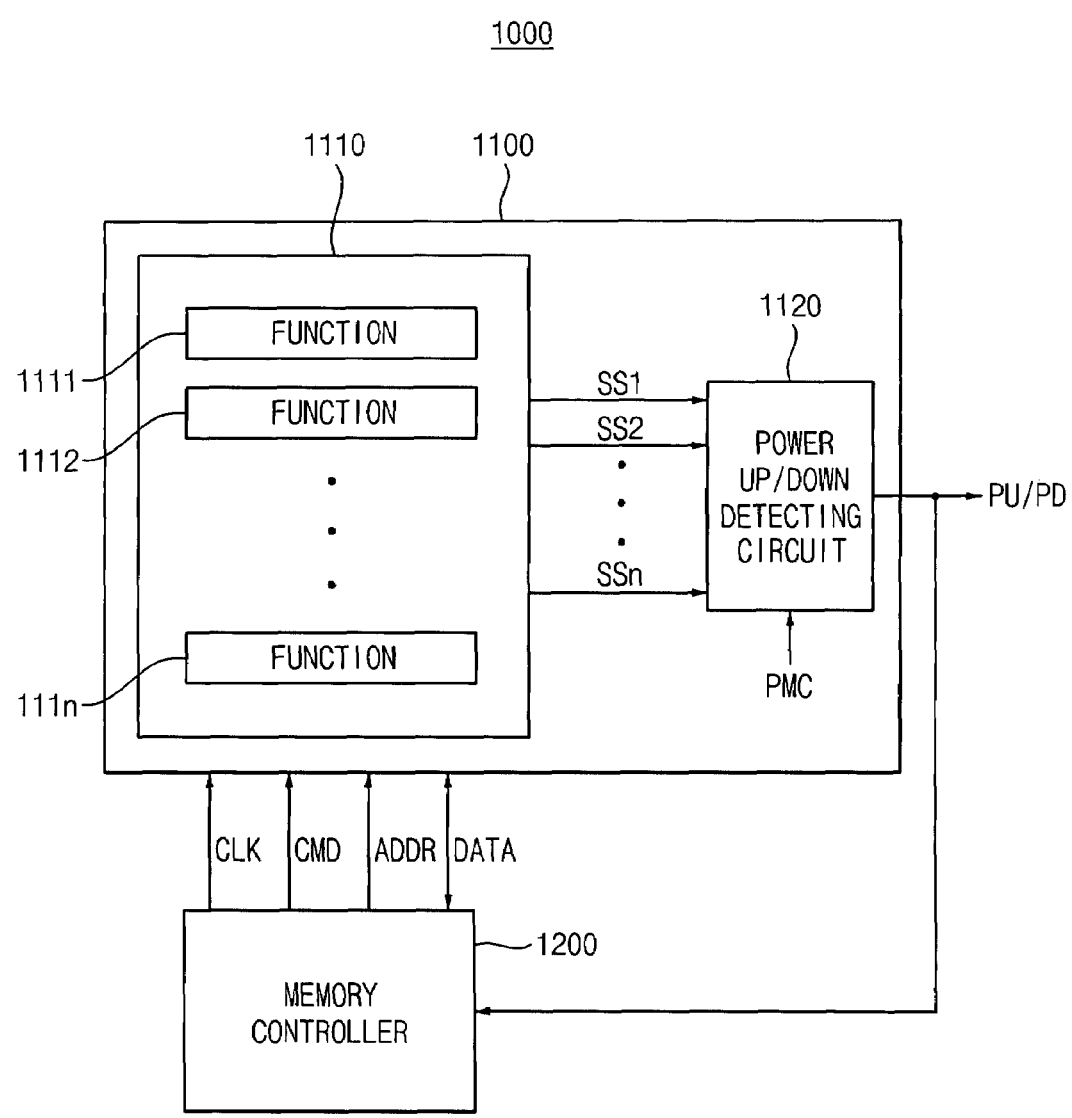
FIGS. 1-9 represent non-limiting, example embodiments as described herein.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a memory system 1000 according to example embodiments.

Referring to FIG. 1, the memory system 1000 may include a semiconductor memory device 1100 and a memory controller 1200.

The semiconductor memory device 1100 may store or output data DATA in response to a clock signal CLK, a command signal CMD, and an address ADDR. The semiconductor memory device 1100 may detect in real time currents flowing through circuit blocks to determine the power-up time and/or the power-down time, and may generate a power-up completion signal PU and/or a power-down completion signal PD.

The memory controller 1200 may provide the clock signal CLK, the command signal CMD, the address ADDR, and data DATA to the semiconductor memory device 1100 in response to the power-up completion signal PU or the power-down completion signal PD.

The semiconductor memory device 1100 may include an internal circuit 1110 and a power-up/power-down detecting circuit 1120. The internal circuit 1110 may include a plurality of function blocks 1111 through 111$n$, and may generate a plurality of sensing signals SS1 through SSn. The power-up/power-down detecting circuit 1120 may determine the power-up time and the power-down time and may generate a power-up completion signal and a power-down completion signal based on a power-mode signal and the sensing signals.

Figure 2:
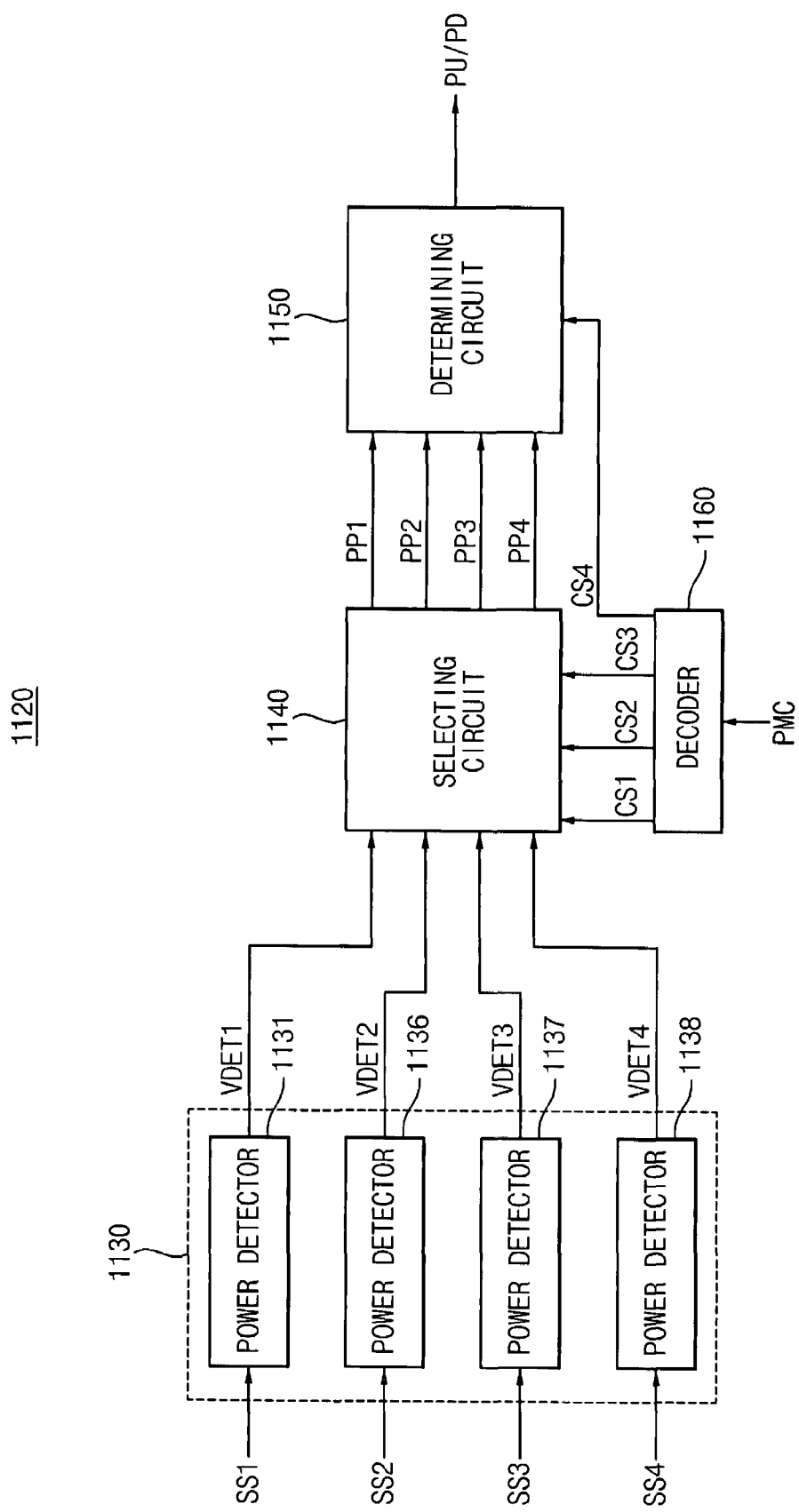

FIG. 2 is a block diagram illustrating the power-up/power-down detecting circuit 1120 according to example embodiments. The power-up/power-down detecting circuit 1120 of FIG. 2 may be employed in the memory system 1000 of FIG. 1.

Referring to FIG. 2, the power-up/power-down detecting circuit 1120 may include a power detecting circuit 1130, a selecting circuit 1140, a determining circuit 1150, and a decoder 1160.

The power detecting circuit 1130 may include power detectors 1131, 1136, 1137, and 1138, and may generate detection signals VDET1, VDET2, VDET3 and VDET4 based on sensing signals SS1, SS2, SS3, and SS4. The decoder 1160 may decode a power-mode signal PMC to generate control signals CS1, CS2, CS3, and CS4. The selecting circuit 1140 may generate selection signals PP1, PP2, PP3, and PP4 based on the control signals CS1, CS2, CS3 and the detection signals VDET1, VDET2, VDET3, and VDET4. The determining circuit 1150 may perform a logical operation on the selection signals PP1, PP2, PP3, and PP4 in response to the control signal CS4 to generate the power-up completion signal PU and the power-down completion signal PD.

Figure 3:
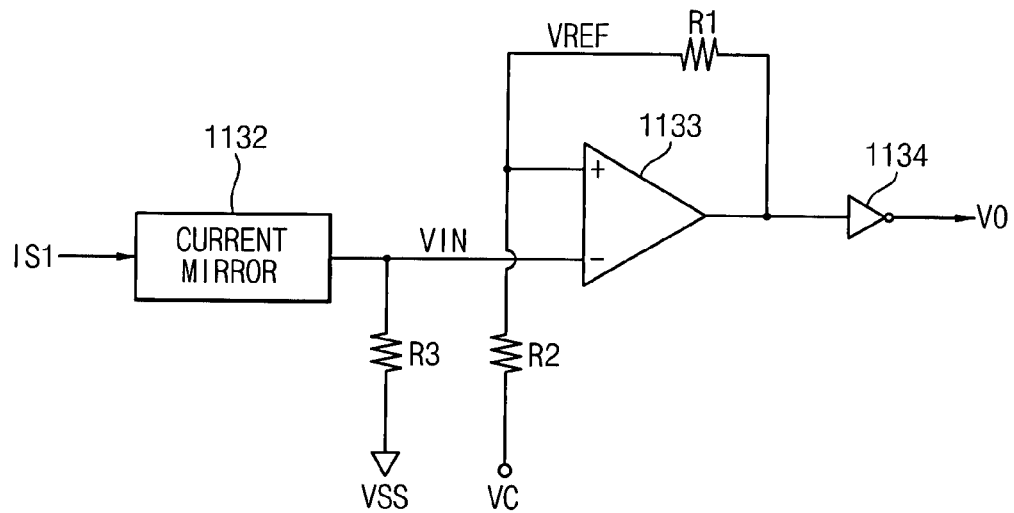

FIG. 3 is a block diagram illustrating an example of a power detector 1131$a$ included in the power-up/power-down detecting circuit of FIG. 2.

Referring to FIG. 3, the power detector 1131a may include a differential amplifier 1133, a first resistor R1, a second resistor R2, a current mirror 1132, a third resistor R3, and an inverter 1134.

The differential amplifier 1133 may have a first differential input terminal to which a first reference voltage VREF is applied, a second differential input terminal to which an amplifier input signal VIN is applied, and an output terminal. The differential amplifier 1133 may amplify the difference between the amplifier input signal VIN and the first reference voltage VREF.

The first resistor R1 may be coupled between the first differential input terminal and the output terminal of the differential amplifier 1133. The second resistor R2 may be coupled between the first differential input terminal and a terminal to which a second reference voltage VC is applied. The current mirror 1132 may be coupled to the second differential input terminal, and may generate a current signal that may be proportional to the input current signal IS1. The third resistor R3 may be coupled between the second differential input terminal and the ground VSS, and may convert the first current signal into the amplifier input signal VIN. The inverter 1134 may invert the output signal of the differential amplifier 1133 to generate a detector output signal VO.

Figure 4:
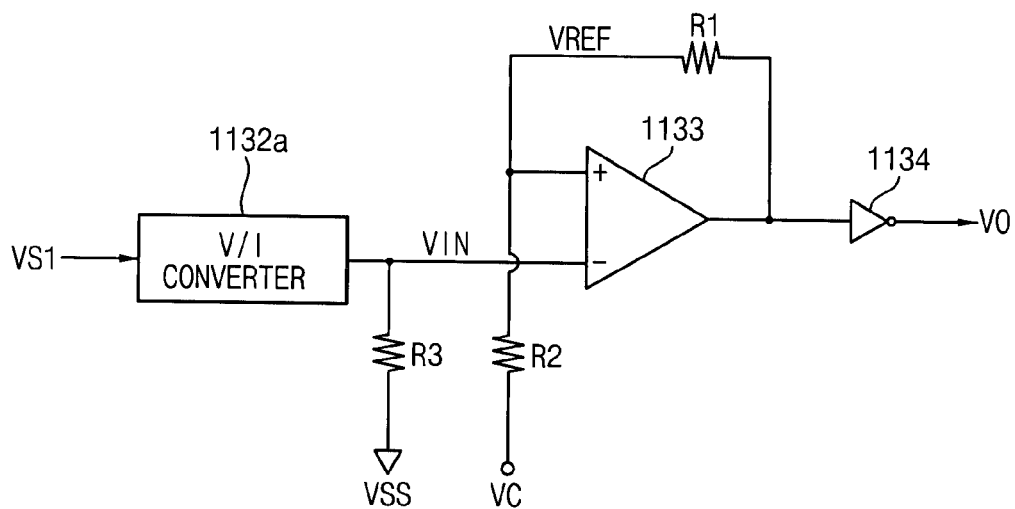

FIG. 4 is a block diagram illustrating another example of a power detector 1131b included in the power-up/power-down detecting circuit 1120 of FIG. 2.

Referring to FIG. 4, the power detector 1131b may include a differential amplifier 1133, a first resistor R1, a second resistor R2, a voltage to current converter 1132a, a third resistor R3, and an inverter 1134.

The differential amplifier 1133 may have a first differential input terminal to which a first reference voltage VREF is applied, a second differential input terminal to which an amplifier input signal VIN is applied, and an output terminal. The differential amplifier 1133 may amplify the difference between the amplifier input signal VIN and the first reference voltage VREF.

The first resistor R1 may be coupled between the first differential input terminal and the output terminal of the differential amplifier 1133. The second resistor R2 may be coupled between the first differential input terminal and a terminal to which a second reference voltage VC is applied. The voltage to current converter 1132a may be coupled to the second differential input terminal, and may perform voltage-to-current conversion on the input voltage signal VS1 to generate a second current signal. The third resistor R3 may be coupled between the second differential input terminal and the ground VSS, and may convert the first current signal into the amplifier input signal VIN. The inverter 1134 may invert the output signal of the differential amplifier 1133 to generate a detector output signal VO.

Figure 5:
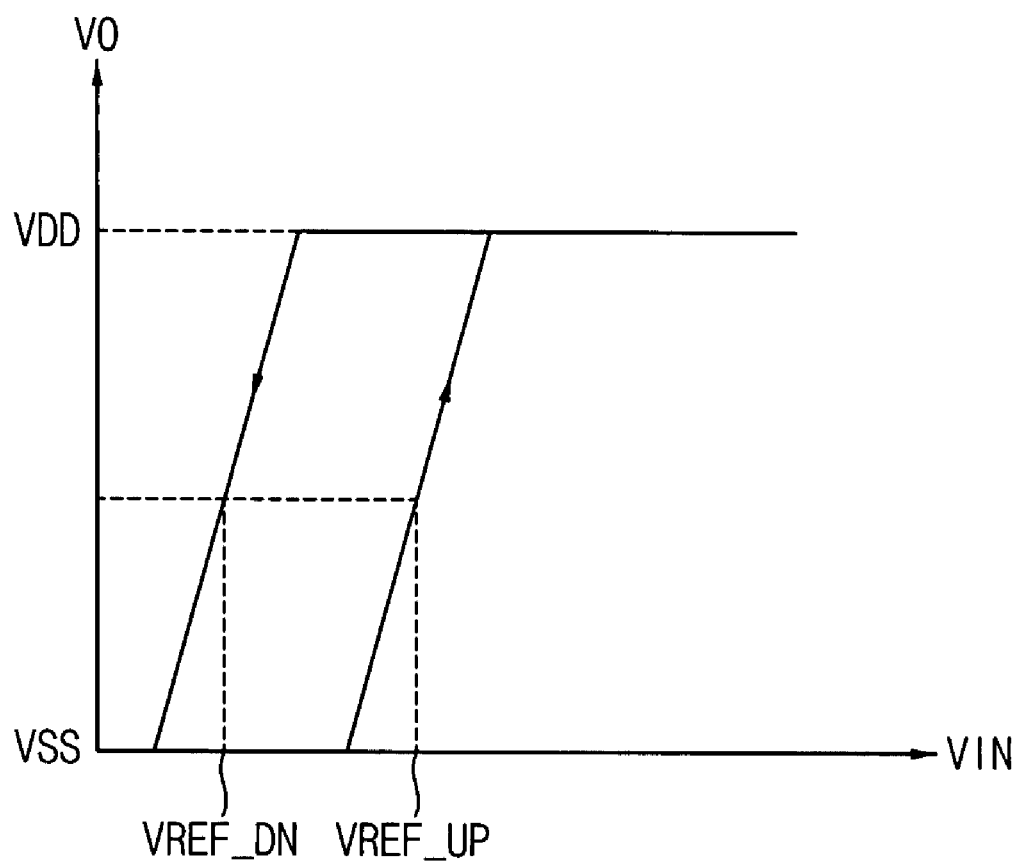

FIG. 5 is a graph illustrating hysteresis characteristics of the power detectors of FIG. 3 and FIG. 4.

Hereinafter, the operation of the power detectors 1131a and 1131b having hysteresis characteristics will be described in reference to FIGS. 3, 4, and 5.

In FIG. 3 and FIG. 4, the input current signal IS1 and the input voltage signal VS1 may be signals corresponding to the sensing signal SS1 illustrated in FIG. 2, and the detector output signal VO may be a signal corresponding to the detection signal VDET1.

In the power detectors 1131a and 1131b illustrated in FIG. 3 and FIG. 4, the amplitude of the amplifier input signal VIN when the detector output signal VO transitions from a logic "low" state to a logic "high" state may be different from the amplitude of the amplifier input signal VIN when the detector output signal VO transitions from a logic "high" state to a logic "low" state. That is, the power detectors 1131a and 1131b may have reference voltages VREF_UP and VREF_DN having different amplitudes when the detector output signal VO is rising and falling.

Referring to FIG. 3, the first current signal that may be proportional to the input current signal IS1 may be provided to the second differential input terminal of the differential amplifier 1133 by the current mirror 1132. The first reference voltage, which may be a voltage of the second differential input terminal of the differential amplifier 1133, may be represented by expression 1 below.

$$VREF=VC+(-VO-VC)\times(R2/(R1+R2)) \quad \text{EXPRESSION 1}$$

The output signal of the differential amplifier 1133 may transition from a logic "high" state to a logic "low" state and the detector output signal VO may transition from a logic "low" state to a logic "high" state when the amplifier input signal VIN becomes larger than the first reference voltage VREF. At this time, the reference voltage VREF_UP may be represented by expression 2 below.

$$VREF\_UP=VC+(VDD-VC)\times(R2/(R1+R2)) \quad \text{EXPRESSION 2}$$

The output signal of the differential amplifier 1133 may transition from a logic "low" state to a logic "high" state and the detector output signal VO may transition from a logic "high" state to a logic "low" state when the amplifier input signal VIN becomes smaller than the first reference voltage VREF. At this time, the reference voltage VREF_DN may be represented by expression 3 below.

$$VREF\_DN=VC-VC\times(R2/(R1+R2)) \quad \text{EXPRESSION 3}$$

Referring to FIG. 4, the input voltage signal VS1 may be converted into the second current signal by the voltage to current converter 1132a, and the second current signal may be provided to the second differential input terminal of the differential amplifier 1133. The second current signal may be converted into the amplifier input signal VIN (e.g., a voltage signal) by the third resistor R3.

The power detector 1131a of FIG. 3 and the power detector 1131b of FIG. 4 may operate similarly with respect to the hysteresis characteristics illustrated in FIG. 5.

As illustrated in FIG. 3 and FIG. 4, the amplifier input signal VIN provided to one input terminal of the differential amplifier 1133 may be a signal in which the input current signal IS1 or the input voltage signal VS1 has been converted to a voltage signal by the third resistor R3.

Figure 6:
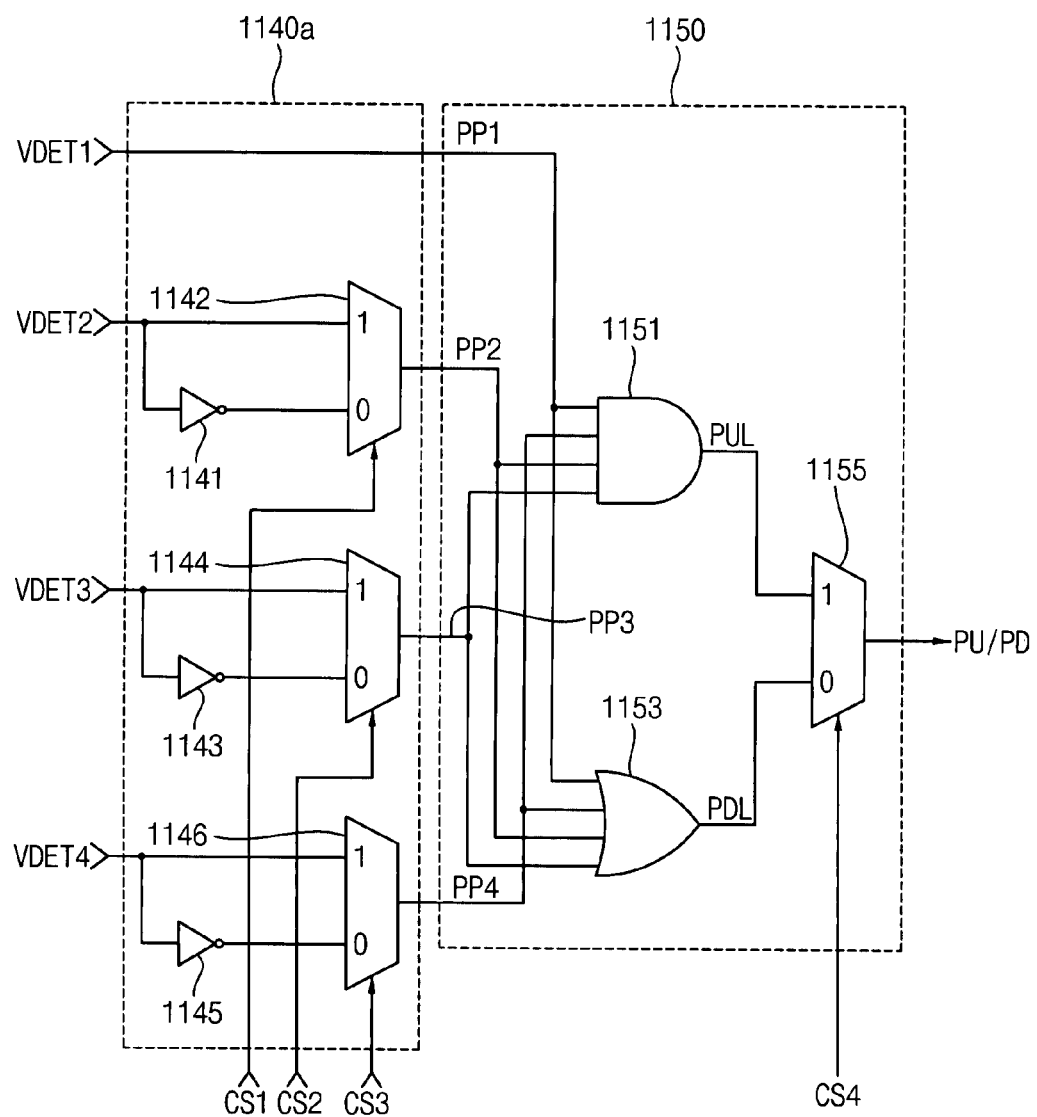

FIG. 6 is a block diagram illustrating an example of a selecting circuit 1140 and a determining circuit 1150 included in the power-up/power-down detecting circuit 1120 of FIG. 2.

Referring to FIG. 6, the selecting circuit 1140a may include a first multiplexer 1142, a second multiplexer 1144, a third multiplexer 1146, a first inverter 1141, a second inverter 1143, and a third inverter 1145.

The selecting circuit 1140a may output the first detection signal VDET1 as the first selection signal PP1. The first inverter 1141 may invert the second detection signal VDET2, the second inverter 1143 may invert the third detection signal VDET3, and the third inverter 1145 may invert the fourth detection signal VDET4.

The first multiplexer 1142 may select one of the second detection signal VDET2 and an output signal of the first inverter 1141 to generate a second selection signal PP2 in response to a first power-up/power-down mode selection control signal CS1.

The second multiplexer 1144 may select one of the third detection signal VDET3 and an output signal of the second inverter 1143 to generate a third selection signal PP3 in response to a second power-up/power-down mode selection control signal CS2.

The third multiplexer 1146 may select one of the fourth detection signal VDET4 and an output signal of the third inverter 1145 to generate a fourth selection signal PP4 in response to a third power-up/power-down mode selection control signal CS3.

The determining circuit 1150 may include an AND gate 1151, an OR gate 1153, and a multiplexer 1155.

The AND gate 1151 may perform a logical AND operation on the selection signals PP1, PP2, PP3, and PP4 to generate a first determination signal PUL. The OR gate 1153 may perform a logical OR operation on the selection signals PP1, PP2, PP3, and PP4 to generate a second determination signal PDL. The multiplexer 1155 may select one of the first determination signal PUL and the second determination signal PDL to generate the power-up completion signal PU and the power-down completion signal PL in response to an up/down control signal CS4.

Hereinafter, the operation of the selection circuit 1140a and the determination circuit 1150 illustrated in FIG. 6 will be described.

The selection circuit 1140a may generate the selection signals PP1, PP2, PP3, and PP4 in response to the detection signals VDET1, VDET2, VDET3, and VDET4, which may be the output signals of the power detecting circuit 1130 illustrated in FIG. 2.

The selection circuit 1140a may output the first detection signal VDET1 as the first selection signal PP1. The first selection signal PP1 may be the same signal as the first detection signal VDET1. The second detection signal VDET2 may be outputted as the second selection signal PP2 when the first power-up/power-down mode selection control signal CS1 is a logic "1", and the inverted signal of the second detection signal VDET2 may be outputted as the second selection signal PP2 when the first power-up/power-down mode selection control signal CS1 is a logic "0".

The third detection signal VDET3 may be outputted as the third selection signal PP3 when the second power-up/power-down mode selection control signal CS2 is a logic "1", and the inverted signal of the third detection signal VDET3 may be outputted as the third selection signal PP3 when the second power-up/power-down mode selection control signal CS2 is a logic "0".

The fourth detection signal VDET4 may be outputted as the fourth selection signal PP4 when the third power-up/power-down mode selection control signal CS3 is a logic "1", and the inverted signal of the fourth detection signal VDET4 may be outputted as the fourth selection signal PP4 when the third power-up/power-down mode selection control signal CS3 is a logic "0".

Therefore, the first selection signal PP1 may have the same logic state as the first detection signal VDET1. The selection circuit 1140a may output the detection signals VDET1, VDET2, VDET3, and VDET4 as they are or the inverted signals depending on the logic states of the control signals CS1, CS2, and CS3. The control signals CS1, CS2, and CS3 may be decoded signals of the power-mode signal PMC as illustrated in FIG. 2.

The determining circuit 1150 may receive the selection signals PP1, PP2, PP3, and PP4 and may perform a logical operation on the selection signals PP1, PP2, PP3, and PP4 to generate the power-up completion signal PU and the power-down completion signal PD. The first determination signal PUL, which may be a power-up determination signal, may have a logic "1" state when all of the detection signals VDET1, VDET2, VDET3, and VDET4 have a logic "1" state. The second determination signal PDL, which may be a power-down determination signal, may have a logic "1" state when any one of the detection signals VDET1, VDET2, VDET3, and VDET4 has a logic "1" state.

The determining circuit 1150 may output the first determination signal PUL as the power-up completion signal PU when the up/down control signal CS4 has a logic "1" state, and may output the second determination signal PDL as the power-down completion signal PD when the up/down control signal CS4 has a logic "0" state.

Figure 7:
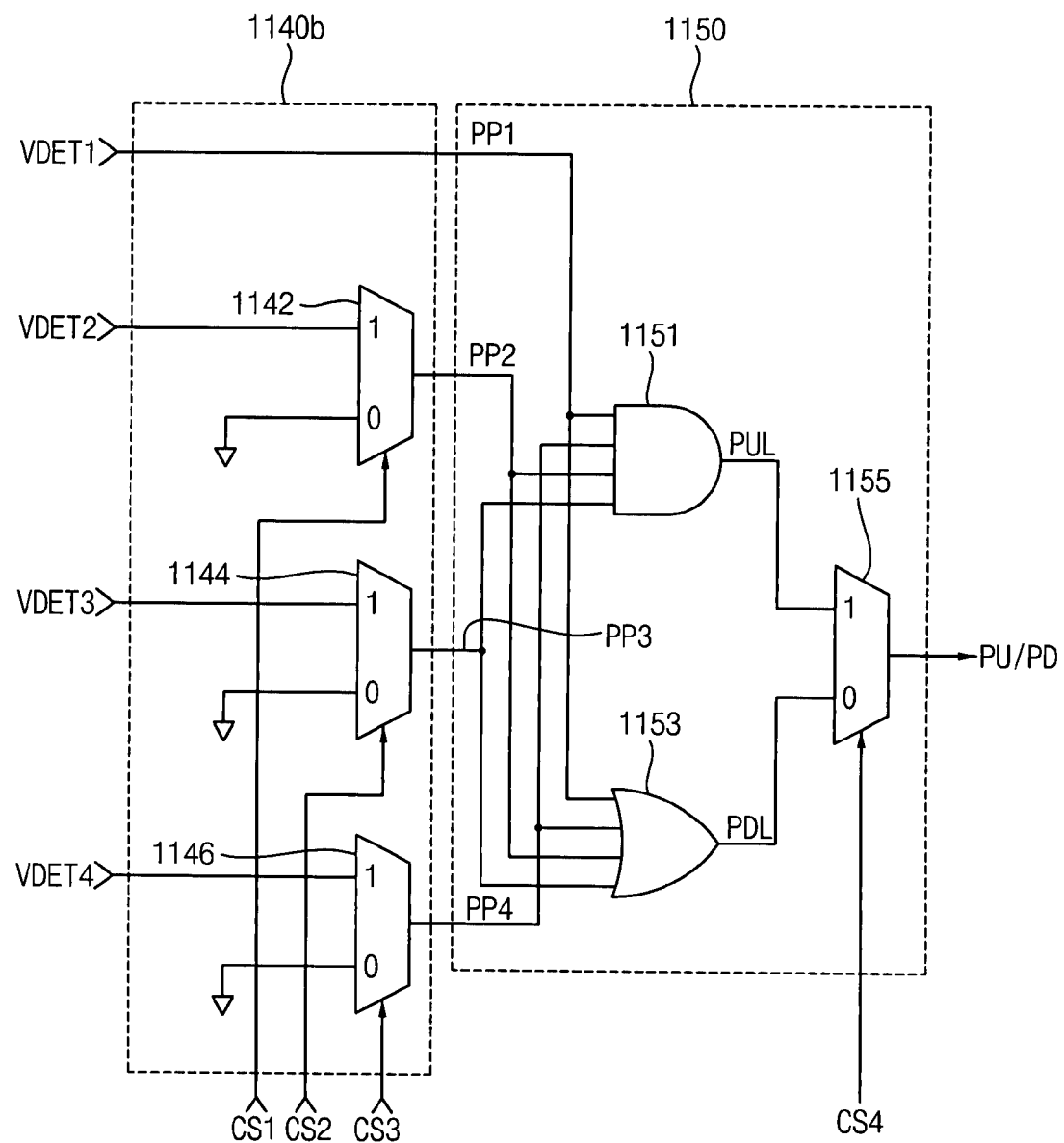

FIG. 7 is a block diagram illustrating another example of a selecting circuit 1140 and a determining circuit 1150 included in the power-up/power-down detecting circuit of FIG. 2.

Referring to FIG. 7, the selecting circuit 1140b may include a first multiplexer 1142, a second multiplexer 1144, and a third multiplexer 1146.

The selecting circuit 1140b may output the first detection signal VDET1 as a first selection signal PP1. The first multiplexer 1142 may have a first input terminal to which the second detection signal VDET2 is applied and a second input terminal to which the ground voltage is applied. The first multiplexer 1142 may select one of the second detection signal VDET2 and the ground voltage to generate a second selection signal PP2 in response to a first power-up/power-down mode selection control signal CS1.

The second multiplexer 1144 may have a first input terminal to which the third detection signal VDET3 is applied and a second input terminal to which the ground voltage is applied. The second multiplexer 1144 may select one of the third detection signal VDET3 and the ground voltage to generate a third selection signal PP3 in response to a second power-up/power-down mode selection control signal CS2. The third multiplexer 1146 may select one of the fourth detection signal VDET4 and the ground voltage to generate a fourth selection signal PP4 in response to a third power-up/power-down mode selection control signal CS2.

The third multiplexer 1146 may have a first input terminal to which the fourth detection signal VDET4 is applied and a second input terminal to which the ground voltage is applied. The third multiplexer 1146 may select one of the fourth detection signal VDET4 and the ground voltage to generate a fourth selection signal PP4 in response to a third power-up/power-down mode selection control signal CS2.

The selecting circuit 1140b illustrated in FIG. 7 may output the ground voltage VSS as each of the selection signals PP2, PP3, and PP4 when each of the control signals CS1, CS2, and CS3 are not selected. That is, each of the detection signals may be not selected, which may be different from the selecting circuit 1140a illustrated in FIG. 6.

In FIG. 7, the determining circuit 1150 may have the same circuit structure as the determining circuit 1150 illustrated in FIG. 6. In addition, the operation of the circuit of FIG. 7 may be similar to the operation of the circuit of FIG. 6. As such, a detailed description of the determining circuit 1150 of FIG. 7 is omitted.

Figure 8:
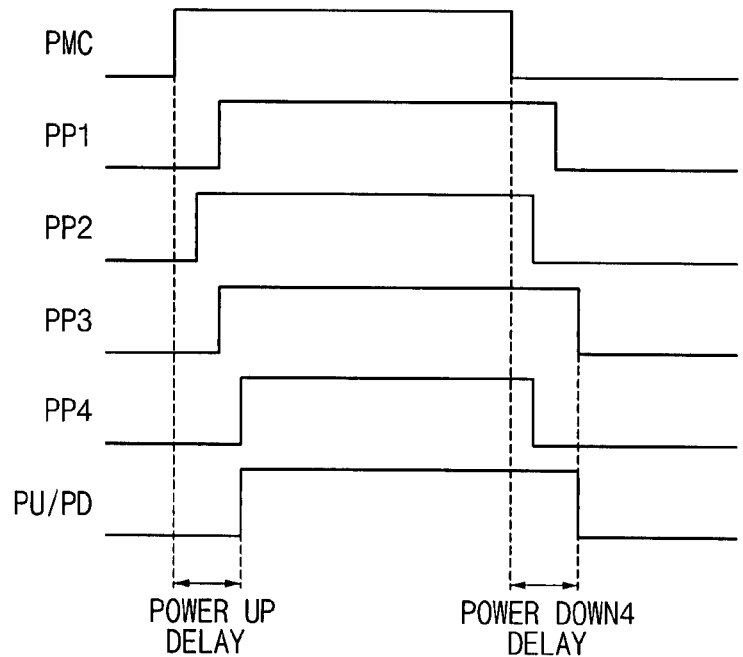
Figure 9:
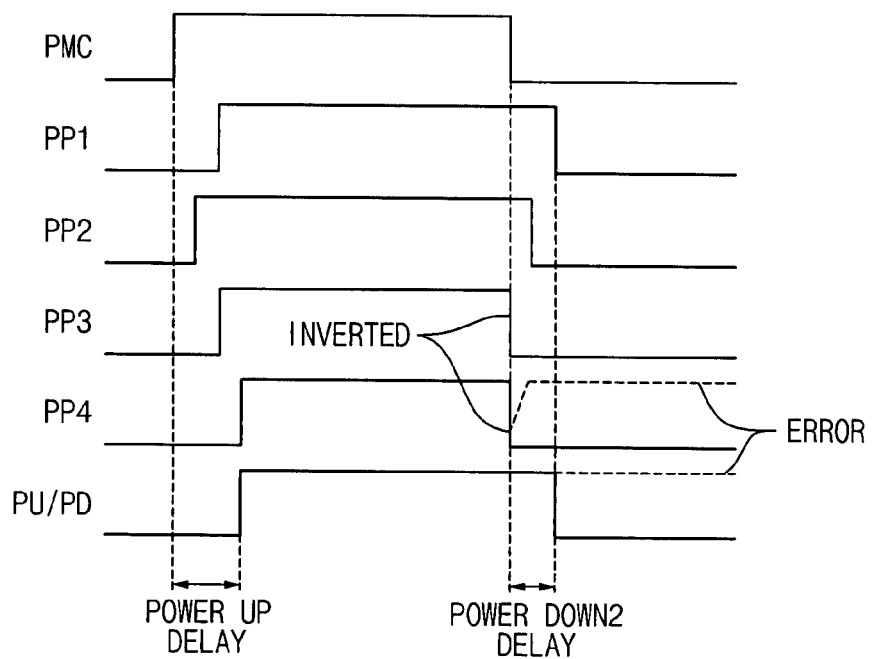

FIG. 8 and FIG. 9 are timing diagrams illustrating operations of the power-up/power-down detecting circuit of FIG. 2. FIG. 8 is a timing diagram illustrating the case when all the sensing signals from the four function blocks are selected when the internal circuit 1110 is composed of four function blocks. FIG. 9 is a timing diagram illustrating the case when two of the sensing signals from the four function blocks are selected.

Hereinafter, the operation of a semiconductor memory device and a memory system including the semiconductor memory device according to example embodiments will be described in reference to FIG. 1 through FIG. 9.

Referring to FIG. 1, the memory controller 1200 may provide the clock signal CLK, the command signal CMD, the address ADDR, and the data DATA to the semiconductor memory device 1100 in response to the power-up completion signal PU or the power-down completion signal PD. The semiconductor memory device 1100 may include the power-up/power-down detecting circuit 1120 that may determine the power-up time and the power-down time based on the power-mode signal PMC and the sensing signals SS1 to SSn outputted from the function blocks 1111 to 111n. The sensing signals SS1 to SSn may be current signals flowing through the function blocks 1111 to 111n, respectively. The power-mode signal PMC may be generated based on the command signal CMD.

Referring to FIG. 2, the power-up/power-down detecting circuit 1120 may include the power detecting circuit 1130, the selecting circuit 1140, the determining circuit 1150, and the decoder 1160, and may generate the detection signals VDET1, VDET2, VDET3, and VDET4 based on the sensing signals SS1, SS2, SS3, and SS4. Further, the power-up/power-down detecting circuit 1120 may perform a logical operation on the detection signals VDET1, VDET2, VDET3, and VDET4 in response to the power-mode signal PMC to generate the power-up completion signal PU and the power-down completion signal PD. The decoder 1160 may decode the power-mode signal PMC to generate the control signals CS1, CS2, CS3, and CS4. For example, the power-mode signal PMC may be a 2-bit signal, and each of the control signals CS1, CS2, CS3, and CS4 may be a 1-bit signal. The power mode may be determined by the control signals CS1, CS2, CS3, and CS4.

In Table 1, an example of setting the power mode is illustrated by sensing currents flowing through a semiconductor memory device that includes four function blocks. FIG. 6 illustrates the power-up/power-down detecting circuit 1120 using the power-mode set illustrated in Table 1. In Table 1, SEL represents that a sensing signal outputted the function block is selected by the selecting circuit 1140. INV represents that a sensing signal outputted from the function block is not selected but inverted, and outputted by the selecting circuit 1140.

TABLE 1

| power modes | block 1 | block 2 | block3 | block 4 |
|---|---|---|---|---|
| power-up/power-down 4 | SEL | SEL | SEL | SEL |
| power-down 1 | SEL | INV | INV | INV |
| power-down 2 | SEL | SEL | INV | INV |
| power-down 3 | SEL | SEL | SEL | INV |

Referring to Table 1, power modes may include a power-down mode 1, a power-down mode 2, a power-down mode 3, and a power-down mode 4. In the power-down mode 1, only the sensing signal SS1 outputted from the first function block (block 1) may be selected, but the sensing signals SS2, SS3, and SS4 outputted from the second to fourth function blocks (block 2, block 3, and block 4) may not be selected. In the power-down mode 2, the sensing signal SS1 outputted from the first function block (block 1) and the sensing signal SS2 outputted from the second function block (block 2) may be selected, but the sensing signal SS3 outputted from the third function block (block 3) and the sensing signal SS4 outputted from the fourth function block (block 4) may not be selected. In the power-down mode 3, the sensing signal SS1 may be outputted from the first function block (block 1), the sensing signal SS2 may be outputted from the second function block (block 2), and the sensing signal SS3 may be outputted from the third function block (block 3) may be selected, but the sensing signal SS4 outputted from the fourth function block (block 4) may not be selected. In the power-down mode 4, the sensing signals SS1, SS2, SS3, and SS4 from all of the function blocks (block 1, block 2, block 3, and block 4) may be selected and outputted.

In reference to Table 1, it may be assumed that, in a power-up mode, the power-up time may be determined by sensing the currents flowing through all of the function blocks included in the internal circuit. Therefore, in the power-up mode, the power-up/power-down detecting circuit 1120 may select the sensing signals SS1, SS2, SS3, and SS4 from all of the function blocks (block 1, block 2, block 3, and block 4) and output the selected signals, similar to the power-down mode 4.

All of the control signals CS1, CS2, and CS3 may have a logic "0" state when the power-up/power-down detecting circuit 1120 operates in the power-down mode 1. The control signal CS1 may have a logic "1" state and the control signals CS2 and CS3 may have a logic "0" state when the power-up/power-down detecting circuit 1120 operates in the power-down mode 2. The control signals CS1 and CS2 may have a logic "1" state and the control signal CS3 may have a logic "0" state when the power-up/power-down detecting circuit 1120 operates in the power-down mode 3. All of the control signals CS1, CS2, and CS3 may have a logic "1" state when the power-up/power-down detecting circuit 1120 operates in the power-down mode 4 or in the power-up mode. That is, the power-up/power-down detecting circuit 1120 may sense the currents flowing through all of the sensing blocks to determine the power-up time when the circuit operates in the power-down mode 4 or in the power-up mode.

In Table 2, another example of setting the power mode is illustrated by sensing currents flowing through a semiconductor memory device that includes four function blocks. FIG. 7 illustrates the power-up/power-down detecting circuit 1120 using the power-mode set illustrated in Table 2. In Table 2, SEL represents a sensing signal outputted from the function block selected by the selecting circuit 1140. VSS represents that a sensing signal outputted from the function block is not selected, but VSS may be outputted by the selecting circuit 1140 instead. That is, the method of setting the power mode as illustrated in Table 2 may not invert a sensing signal outputted from a function block when the sensing signal is not selected. Instead, the ground voltage VSS may be outputted.

TABLE 2

| power modes | block 1 | block 2 | block3 | block 4 |
|---|---|---|---|---|
| power-up/power-down 4 | SEL | SEL | SEL | SEL |
| power-down 1 | SEL | VSS | VSS | VSS |
| power-down 2 | SEL | SEL | VSS | VSS |
| power-down 3 | SEL | SEL | SEL | VSS |

FIG. 8 illustrates waveforms of the selection signals PP1, PP2, PP3, and PP4, which may be outputs of the selecting circuit 1140, when a semiconductor memory device operates in the power-up mode and the power-down mode 4. In the power-up mode, the sensing signals SS1, SS2, SS3, and SS4 outputted from all the function blocks may be selected and outputted. In the power-up mode, the power-up completion signal PU may be enabled in response to the selection signal PP4, which may transition to a logic "1" last among the selection signals PP1, PP2, PP3, and PP4 corresponding to the function blocks. A power-up delay corresponding to the time period from the time when the power-mode signal PMC is enabled to the time when the power-up completion signal PU is enabled.

Referring to Table 1, in power-down mode 4, the sensing signals SS1, SS2, SS3, and SS4 from all of the function blocks included in the internal circuit may be selected and outputted. In the power-down mode 4, the power-down completion signal PD may be enabled in response to the selection signal PP3, which may transition to a logic "0" last among the selection signals PP1, PP2, PP3, and PP4 corresponding to the function blocks. In the timing diagram of FIG. 8, the power-down completion signal PD may be enabled when the signal has a logic "0" state. A power-down delay may correspond to the time period from the time when the power-mode signal PMC is disabled to the time when the power-down completion signal PD is enabled.

Referring to the timing diagram illustrated in FIG. 8 and the determining circuit 1150 illustrated in FIG. 6, the power-up completion signal PU may be enabled when all the selection signals PP1, PP2, PP3, and PP4 corresponding to the function blocks have a logic "1" state, and the power-down completion signal PD may be enabled when all the selection signals PP1, PP2, PP3, and PP4 corresponding to the function blocks have a logic "0" state.

FIG. 9 illustrates waveforms of the selection signals PP1, PP2, PP3, and PP4, which may be outputs of the selecting circuit 1140, when a semiconductor memory device operates in the power-up mode and the power-down mode 2. In the power-up mode, the sensing signals SS1, SS2, SS3, and SS4 outputted from all the function blocks may be selected and outputted. In the power-up mode, the power-up completion signal PU may be enabled in response to the selection signal PP4, which may transition to a logic "1" last among the selection signals PP1, PP2, PP3, and PP4 corresponding to the function blocks. A power-up delay may be determined by the time period from the time when the power-mode signal PMC is enabled to the time when the power-up completion signal PU is enabled.

Referring to Table 1, in the power-down mode 2, the sensing signal SS1 outputted from the first function block (block 1) and the sensing signal SS2 outputted from the second function block (block 2) may be selected, but the sensing signal SS3 outputted from the third function block (block 3) and the sensing signal SS4 outputted from the fourth function block (block 4) may not be selected. In the power-down mode 2, the selection signals PP3 and PP4 corresponding to the third and fourth function blocks (block 3 and block 4) may be inverted and outputted, but the selection signals PP1 and PP2 corresponding to the first and second function blocks (block 1 and block 2) may not be inverted and outputted. In the power-down mode 2, the power-down completion signal PD may be enabled in response to the selection signal PP1, which may transition to a logic "0" later between the selection signals PP1 and PP2, corresponding to the first and second function blocks (block 1 and block 2). In the timing diagram of FIG. 9, the power-down completion signal PD may be enabled when the signal has a logic "0" state. A power-down delay may be determined by the time period from the time when the power-mode signal PMC is disabled to the time when the power-down completion signal PD is enabled.

Referring to the timing diagram illustrated in FIG. 9 and the determining circuit 1150 illustrated in FIG. 6, the power-up completion signal PU may be enabled when all of the selection signals PP1, PP2, PP3, and PP4 corresponding to the function blocks have a logic "1" state, and the power-down completion signal PD may be enabled when all of the selection signals PP1, PP2, PP3, and PP4 corresponding to the function blocks have a logic "0" state.

If the method of setting the power-mode as illustrated in Table 1 is used, as illustrated in FIG. 9, the power-down completion signal PD may not transition to a logic "0" or the PD may transition to a logic "0" temporarily and then return to a logic "1" immediately when noise is included in the selection signal PP4 corresponding to the function block (block 4). In addition, errors may be generated. The power-mode signal PMC may be set so as to determine the power-down time and to generate the power-down completion signal PD. However, when errors are included in the selection signals PP2, PP3, and PP4, the power-down completion signal PD may retain a logic "1" state. Therefore, if the power-mode signal PMC and the power-down completion signal PD are compared with each other, it may be determined that there is a problem in the power-down operation.

The memory controller 1200 may operate in response to the power-up time or the power-down time. Therefore, the power-up/power-down standby time for the memory controller 1200 may be decreased. In the conventional art, there may be an unnecessary standby time for transmitting data and commands between a memory controller and a semiconductor memory device because the power-up/power-down time cannot be determined in real time.

In above example embodiments, a semiconductor memory device having a power-up/power-down detecting circuit is described, but example embodiments may be applied to various semiconductor devices having the power-up/power-down detecting circuit.

As described above, the power-up/power-down detecting circuit according to example embodiments may provide the power-up time or the power-down time in real time, and may decrease the power-up standby time and the power-down standby time in normal mode. Further, the power-up/power-down detecting circuit according to example embodiments may detect errors of a power-down operation by inverting selection signals corresponding to function blocks that are not selected. A semiconductor memory device including the power-up/power-down detecting circuit according to example embodiments may decrease the power-up standby time and the power-down standby time because the semiconductor memory device may provide the power-up time or the power-down time in real time.

The foregoing is illustrative of example embodiments and is not to be construed as limiting thereof. Although example embodiments have been described, those skilled in the art will readily appreciate that many modifications are possible in example embodiments without materially departing from the novel teachings and advantages of example embodiments. Accordingly, all such modifications are intended to be included within the scope of the claims. Therefore, it is to be understood that the foregoing is illustrative of example embodiments and is not to be construed as limited to the specific embodiments disclosed, and that modifications to the disclosed embodiments, as well as other embodiments, are intended to be included within the scope of the appended claims. Example embodiments are defined by the following claims, with equivalents of the claims to be included therein.

What is claimed is:

1. A power-up/power-down detecting circuit, comprising:
a power detecting circuit configured to generate a plurality of detection signals based on a plurality of sensing signals corresponding to currents flowing through a plurality of function blocks;
a selecting circuit configured to generate a plurality of selection signals based on a power-up/power-down mode selection control signal and the detection signals; and
a determining circuit configured to perform a logical operation on the selection signals in response to an up/down control signal to generate a power-up completion signal and a power-down completion signal.

2. The power-up/power-down detecting circuit of claim 1, further comprising:
a decoder configured to decode a power-mode signal to generate the power-up/power-down mode selection control signal and the up/down control signal.

3. The power-up/power-down detecting circuit of claim 2, wherein the power-up completion signal is enabled when all the selection signals are enabled.

4. The power-up/power-down detecting circuit of claim 3, wherein a power-up delay is determined by a time period from a time when the power-mode signal is enabled to a time when the power-up completion signal is enabled.

5. The power-up/power-down detecting circuit of claim 2, wherein the power-down completion signal is enabled when all the selection signals are disabled.

6. The power-up/power-down detecting circuit of claim 5, wherein the power-down completion signal is enabled in response to the selection signal that is disabled last.

7. The power-up/power-down detecting circuit of claim 6, wherein a power-down delay is determined by a time period from a time when the power-mode signal is enabled to a time when the power-down completion signal is enabled.

8. The power-up/power-down detecting circuit of claim 1, wherein the power detecting circuit includes a plurality of power detectors, each of the power detectors comparing each of the sensing signals with a reference signal to generate each of the detection signals.

9. The power-up/power-down detecting circuit of claim 8, wherein each of the power detectors has hysteresis characteristics.

10. The power-up/power-down detecting circuit of claim 8, wherein each of the power detectors comprises:
a differential amplifier having a first differential input terminal to which a first reference voltage is applied and a second differential input terminal to which an amplifier input signal is applied, the differential amplifier being configured to amplify a difference between the amplifier input signal and the first reference voltage;
a first resistor coupled between the first differential input terminal and an output terminal of the differential amplifier;
a second resistor coupled between the first differential input terminal and a terminal to which a second reference voltage is applied;
a current mirror coupled to the second differential input terminal, the current mirror being configured to generate a first current signal that is proportional to an input current signal;
a third resistor coupled between the second differential input terminal and a ground, the third resistor being configured to convert the first current signal into the amplifier input signal; and
an inverter configured to invert an output signal of the differential amplifier.

11. The power-up/power-down detecting circuit of claim 8, wherein each of the power detectors includes:
a differential amplifier having a first differential input terminal to which a first reference voltage is applied and a second differential input terminal to which an amplifier input signal is applied, the differential amplifier being configured to amplify a difference between the amplifier input signal and the first reference voltage;
a first resistor coupled between the first differential input terminal and an output terminal of the differential amplifier;
a second resistor coupled between the first differential input terminal and a terminal to which a second reference voltage is applied;
a voltage to current converter coupled to the second differential input terminal, the voltage to current converter being configured to perform voltage-to-current conversion on an input voltage signal to generate a second current signal;
a third resistor coupled between the second differential input terminal and a ground, the third resistor being configured to convert the second current signal into the amplifier input signal; and
an inverter configured to invert an output signal of the differential amplifier.

12. The power-up/power-down detecting circuit of claim 1, wherein the selecting circuit includes a plurality of multiplexers, each of the multiplexers selecting one of a first detection signal and a second detection signal to output a selection signal in response to the power-up/power-down mode selection control signal, the second detection signal corresponding to an inverted signal of the first detection signal.

13. The power-up/power-down detecting circuit of claim 1, wherein the selecting circuit outputs a first detection signal as a first selection signal, and
wherein the selecting circuit includes:
a first inverter configured to invert a second detection signal;
a second inverter configured to invert a third detection signal;
a third inverter configured to invert a fourth detection signal;
a first multiplexer configured to select one of the second detection signal and an output signal of the first inverter to generate a second selection signal in response to a first power-up/power-down mode selection control signal;
a second multiplexer configured to select one of the third detection signal and an output signal of the second inverter to generate a third selection signal in response to a second power-up/power-down mode selection control signal; and
a third multiplexer configured to select one of the fourth detection signal and an output signal of the third inverter to generate a fourth selection signal in response to a third power-up/power-down mode selection control signal.

14. The power-up/power-down detecting circuit of claim 1, wherein the selecting circuit outputs a first detection signal as a first selection signal, and
wherein the selecting circuit includes:
a first multiplexer configured to select one of a second detection signal and a ground voltage to generate a second selection signal in response to a first power-up/power-down mode selection control signal;
a second multiplexer configured to select one of a third detection signal and the ground voltage to generate a third selection signal in response to a second power-up/power-down mode selection control signal; and a third multiplexer configured to select one of a fourth detection signal and the ground voltage to generate a fourth selection signal in response to a third power-up/power-down mode selection control signal.

15. The power-up/power-down detecting circuit of claim 1, wherein the determining circuit includes:

an AND gate configured to perform a logical AND operation on the selection signals to generate a first determination signal;

an OR gate configured to perform a logical OR operation on the selection signals to generate a second determination signal; and a multiplexer configured to select one of the first determination signal and the second determination signal to generate the power-up completion signal and the power-down completion signal in response to the up/down control signal.

16. The power-up/power-down detecting circuit of claim 15, wherein the multiplexer outputs the first determination signal when the up/down control signal is enabled, and outputs the second determination signal when the up/down control signal is disabled.

17. A semiconductor device, comprising:

an internal circuit configured to include a plurality of function blocks, and configured to generate a plurality of sensing signals; and a power-up/power-down detecting circuit configured to generate a power-up completion signal and a power-down completion signal based on a power-mode signal and the sensing signals, the power-up completion signal and the power-down completion signal indicating a power-up time and a power-down time, respectively.

18. The semiconductor device of claim 17, wherein the power-up/power-down detecting circuit comprises:

a power detecting circuit configured to generate a plurality of detection signals based on the plurality of sensing signals corresponding to currents flowing through the plurality of function blocks;

a selecting circuit configured to generate a plurality of selection signals based on a power-up/power-down mode selection control signal and the detection signals; and a determining circuit configured to perform logical operations on the selection signals in response to an up/down control signal to generate the power-up completion signal and the power-down completion signal.

19. The semiconductor device of claim 18, wherein the power-up/power-down detecting circuit further comprises:

a decoder configured to decode a power-mode signal to generate the power-up/power-down mode selection control signal and the up/down control signal.

20. The semiconductor device of claim 19, wherein the power-up completion signal is enabled when all the selection signals are enabled.

21. The semiconductor device of claim 19, wherein the power-down completion signal is enabled when all the selection signals are disabled.

22. A memory system, comprising:

a semiconductor memory device configured to store input data or output stored data in response to a clock signal, a command signal, and an address, configured to detect currents flowing through circuit blocks in real time to determine a power-up time and a power-down time, and configured to generate a power-up completion signal and a power-down completion signal; and a memory controller configured to provide the clock signal, the command signal, the address, and the input data to the semiconductor memory device in response to the power-up completion signal or the power-down completion signal.

23. The memory system of claim 22, wherein the semiconductor memory device includes:

an internal circuit including a plurality of function blocks, and configured to generate a plurality of sensing signals; and a power-up/power-down detecting circuit configured to generate a power-up completion signal and a power-down completion signal based on a power-mode signal and the sensing signals, the power-up completion signal and the power-down completion signal indicating a power-up time and a power-down time, respectively.

24. The memory system of claim 23, wherein the power-up/power-down detecting circuit comprises:

a power detecting circuit configured to generate a plurality of detection signals based on the sensing signals corresponding to currents flowing through the function blocks;

a selecting circuit configured to generate a plurality of selection signals based on a power-up/power-down mode selection control signal and the detection signals; and a determining circuit configured to perform logical operations on the selection signals in response to an up/down control signal to generate a power-up completion signal and a power-down completion signal.

* * * * *